US009041693B2

(12) United States Patent
Chung

(10) Patent No.: US 9,041,693 B2
(45) Date of Patent: May 26, 2015

(54) SCAN DRIVER AND ORGANIC LIGHT EMITTING DISPLAY USING THE SCAN DRIVER

(75) Inventor: Kyung-Hoon Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1110 days.

(21) Appl. No.: 12/903,183

(22) Filed: Oct. 12, 2010

(65) Prior Publication Data

US 2011/0227883 A1 Sep. 22, 2011

(30) Foreign Application Priority Data

Mar. 16, 2010 (KR) .................. 10-2010-0023403

(51) Int. Cl.
| | | |
|---|---|---|
| G06F 3/038 | (2013.01) | |
| G09G 5/00 | (2006.01) | |
| G11C 19/28 | (2006.01) | |
| G09G 3/32 | (2006.01) | |
| G11C 19/18 | (2006.01) | |

(52) U.S. Cl.
CPC .............. *G11C 19/28* (2013.01); *G09G 3/3266* (2013.01); *G11C 19/184* (2013.01); *G09G 2310/0286* (2013.01)

(58) Field of Classification Search
CPC ................. G09G 2310/0286; G09G 3/3266; G11C 19/184; G11C 19/28
USPC ............ 345/76, 92, 100, 204, 97–98; 257/59; 377/57, 64
See application file for complete search history.

(56) References Cited

U.S. PATENT DOCUMENTS

| | | | |
|---|---|---|---|
| 6,107,978 A | 8/2000 | Nagaoka et al. | |
| 2005/0021883 A1* | 1/2005 | Shishizuka et al. | 710/20 |
| 2006/0114208 A1* | 6/2006 | Senda | 345/90 |
| 2006/0145998 A1* | 7/2006 | Cho et al. | 345/100 |
| 2007/0008268 A1* | 1/2007 | Park et al. | 345/92 |
| 2007/0262310 A1 | 11/2007 | Park et al. | |
| 2007/0274433 A1* | 11/2007 | Tobita | 377/64 |
| 2010/0002827 A1* | 1/2010 | Shih et al. | 377/57 |

FOREIGN PATENT DOCUMENTS

| | | | |
|---|---|---|---|
| JP | 3408684 B2 | 3/2003 | |
| KR | 10-2006-0126128 A | 12/2006 | |

(Continued)

OTHER PUBLICATIONS

KIPO Registration Determination Certificate dated Aug. 30, 2001, for priority application 10-2010-0023403, 5 pages.

*Primary Examiner* — Kumar Patel
*Assistant Examiner* — Insa Sadio
(74) *Attorney, Agent, or Firm* — Christie, Parker & Hale, LLP

(57) ABSTRACT

A scan driver includes a plurality of stages for receiving a first start signal and a second start signal, a first clock signal and a second clock signal, and at least one of two interrupt signals and outputting a scan signal. Each stage includes an up-signal output unit for receiving the first start signal and for outputting a first output signal that is shifted by one horizontal period from the first start signal, a down-signal output unit for receiving a second start signal and outputting a second output signal shifted by one horizontal period from the second start signal, and a scan signal output unit for receiving the first and second output signals and outputting a high-level or low-level scan signal.

17 Claims, 7 Drawing Sheets

(56) References Cited

FOREIGN PATENT DOCUMENTS

| KR | 10-2007-0022550 A | 2/2007 |
| KR | 10-2007-0049906 A | 5/2007 |
| KR | 10-0759672 B1 | 9/2007 |
| KR | 10-2007-0109345 A | 11/2007 |
| KR | 10-2007-0121968 A | 12/2007 |
| KR | 10-2008-0000850 A | 1/2008 |

* cited by examiner

SCAN DRIVER AND ORGANIC LIGHT EMITTING DISPLAY USING THE SCAN DRIVER

CROSS-REFERENCE TO RELATED PATENT APPLICATIONS

This application claims priority to and the benefit of Korean Patent Application No. 10-2010-0023403, filed on Mar. 16, 2010, in the Korean Intellectual Property Office, the disclosure of which is incorporated herein in its entirety by reference.

BACKGROUND

1. Field

Aspects of embodiments according to the present invention relate to a scan driver and an organic light emitting display using the scan driver.

2. Description of the Related Art

A variety of light emitting display devices having a small weight and a small size have been developed. An organic light emitting display is one such device, which has superior light emission efficiency, brightness, and viewing angle and a fast response speed. Organic light emitting displays are used as display devices for personal computers, mobile phones, and portable information terminals such as personal digital assistants (PDAs), or for a variety of information devices.

Organic light emitting displays include an organic light emitting panel having a plurality of pixels electrically coupled to scan lines and data lines crossing the scan lines, a scan driver for driving the scan lines, and a data driver for driving the data lines. The scan driver sequentially provides scan signals to the organic light emitting panel via the scan lines. The data driver sequentially provides data signals to the organic light emitting panel via the data lines. The organic light emitting panel is electrically coupled to the data lines and the scan lines and emits light by receiving the data signals and the scan signals.

SUMMARY

Aspects of the present invention provide a scan driver which may prevent the generation of abnormal scan signals and provide a regular image, and an organic light emitting display using the scan driver.

According to an embodiment of the present invention, a scan driver includes a plurality of stages for receiving a first start signal and a second start signal, a first clock signal and a second clock signal, and at least one of two interrupt signals and for outputting a scan signal, each stage including: an up-signal output unit for receiving the first start signal and outputting a first output signal that is shifted by one horizontal period from the first start signal; a down-signal output unit for receiving the second start signal and outputting a second output signal that is shifted by one horizontal period from the second start signal; and a scan signal output unit for receiving the first and second output signals and for outputting the scan signal having a high level or a low level.

The first and second start signals may be input at an interval of 2n times one horizontal period, the scan signal may be output with a pulse width of 2n times one horizontal period, and the scan signals may overlap with each other by (2n−1) times one horizontal period, wherein "n" is a natural number.

The first and second start signals may be input at an interval of (2n+1) times one horizontal period, the scan signal may be output with a pulse width of (2n+1) times one horizontal period, and the scan signals may overlap with each other by 2n times one horizontal period, wherein "n" is a natural number.

In an odd stage, the first clock signal may be applied to a first clock terminal and the second clock signal is applied to a second clock terminal, and in an even stage, the second clock signal may be applied to the first clock terminal and the first clock signal is applied to the second clock terminal.

The up-signal output unit may include: a second switching device including a gate electrode coupled to a first input terminal for receiving the first start signal, a first electrode coupled to a first power source, and a second electrode coupled to a second node; a first switching device including a gate electrode coupled to the first clock terminal for receiving the first clock signal, a first electrode coupled to the first input terminal, and a second electrode coupled to a first node; a third switching device including a gate electrode coupled to the second node, a first electrode coupled to the first power source, and a second electrode coupled to the first node; a fourth switching device including a gate electrode coupled to an interrupt terminal for receiving a first interrupt signal of the two interrupt signals, a first electrode coupled to the second node, and a second electrode coupled to a second power source; a fifth switching device including a gate electrode coupled to the second node, a first electrode coupled to the first power source, and a second electrode coupled to a first output terminal; and a sixth switching device including a gate electrode coupled to the first node, a first electrode coupled to the first output terminal, and a second electrode coupled to a second clock terminal for receiving the second clock signal.

The scan driver may further include: a first capacitive device coupled between the first node and the first output terminal; and a second capacitive device coupled between the first power source and the second node.

The down-signal output unit may include: a twelfth switching device including a gate electrode coupled to a second input terminal for receiving the second start signal, a first electrode coupled to a first power source, and a second electrode coupled to a fourth node; an eleventh switching device including a gate electrode coupled to a first clock terminal for receiving the first clock signal, a first electrode coupled to the second input terminal, and a second electrode coupled to a third node; a thirteenth switching device including a gate electrode coupled to the fourth node, a first electrode coupled to the first power source, and a second electrode coupled to the third node; a fourteenth switching device including a gate electrode coupled to an interrupt terminal for receiving the first interrupt signal, a first electrode coupled to the fourth node, and a second electrode coupled to a second power source; a fifteenth switching device including a gate electrode coupled to the fourth node, a first electrode coupled to the first power source, and a second electrode coupled to a second output terminal; and a sixteenth switching device including a gate electrode coupled to the third node, a first electrode coupled to the second output terminal, and a second electrode coupled to a second clock terminal for receiving the second clock signal.

The scan driver may further include: a third capacitive device coupled between the third node and the second output terminal; and a fourth capacitive device coupled between the first power source and the fourth node.

The down-signal output unit may include: a twelfth switching device including a gate electrode coupled to a second input terminal for receiving the second start signal, a first electrode coupled to a first power source, and a second electrode coupled to a fourth node; an eleventh switching device including a gate electrode coupled to a second clock terminal for receiving the second clock signal, a first electrode coupled to the second input terminal, and a second electrode coupled to a third node; a thirteenth switching device including a gate electrode coupled to the fourth node, a first electrode coupled to the first power source, and a second electrode coupled to the third node; a fourteenth switching device including a gate electrode coupled to an interrupt terminal for receiving a second interrupt signal of the two interrupt signals, wherein the second interrupt signal is phase-shifted from a first interrupt signal received by the up-signal output unit, a first electrode coupled to the fourth node, and a second electrode coupled to a second power source; a fifteenth switching device including a gate electrode coupled to the fourth node, a first electrode coupled to the first power source, and a second electrode coupled to a second output terminal; and a sixteenth switching device including a gate electrode coupled to the third node, a first electrode coupled to the second output terminal, and a second electrode coupled to a second clock terminal for receiving the first clock signal.

The scan driver may further include: a third capacitive device coupled between the third node and the second output terminal; and a fourth capacitive device coupled between the first power source and the fourth node.

The scan signal output unit may include: an eighteenth switching device including a gate electrode coupled to an output terminal of the up-signal output unit, a first electrode coupled to a first power source, and a second electrode coupled to a fifth node; a seventeenth switching device including a gate electrode coupled to the output terminal of the up-signal output unit, a first electrode coupled to a sixth node, and a second electrode coupled to a second power source; a nineteenth switching device including a gate electrode coupled to an output terminal of the down-signal output unit, a first electrode coupled to the fifth node, and a second electrode coupled to the second power source; a twentieth switching device including a gate electrode coupled to the fifth node, a first electrode coupled to the first power source, and a second electrode coupled to the sixth node; a twenty-first switching device including a gate electrode coupled to the fifth node, a first electrode coupled to a third output terminal, and a second electrode coupled to the second power source; and a twenty-second switching device including a gate electrode coupled to the sixth node, a first electrode coupled to the first power source, and a second electrode coupled to the third output terminal.

The scan driver may further include: a fifth capacitive device coupled between the fifth node and the third output terminal; and a sixth capacitive device coupled between the first power source and the sixth node.

The first start signal may be an original start signal or an output signal of an up-signal output unit in a previous stage, and the second start signal may be an original start signal or an output signal of a down-signal output unit in the previous stage.

In an odd stage, the first clock signal, the second clock signal, and a first interrupt signal of the two interrupt signals may be sequentially input to the up-signal output unit and the down-signal output unit, and in an even stage, the second clock signal, the first clock signal, and a second interrupt signal of the two interrupt signals may be sequentially input to the up-signal output unit and the down-signal output unit.

In an odd stage, the first clock signal, the second clock signal, and a first interrupt signal of the two interrupt signals may be sequentially input to the up-signal output unit, and the second clock signal, the first clock signal, and a second interrupt signal of the two interrupt signals may be sequentially input to the down-signal output unit. And in an even stage, the second clock signal, the first clock signal, and the second interrupt signal may be sequentially input to the up-signal output unit, and the first clock signal, a second clock signal, and the first interrupt signal may be sequentially input to the down-signal output unit.

According to another embodiment of the present invention, an organic light emitting display includes: an organic light emitting panel including a plurality of pixels located at the crossing regions of a plurality of data lines and a plurality of scan lines; a data driver coupled to the plurality of data lines, and configured to apply data signals to the plurality of data lines; and a scan driver coupled to the plurality of scan lines, the scan driver including a plurality of stages for receiving a first start signal and a second start signal, a first clock signal and a second clock signal, and at least one of two interrupt signals and for outputting the scan signal, each stage including: an up-signal output unit for receiving the first start signal and for outputting the first output signal that is shifted by one horizontal period from the first start signal; a down-signal output unit for receiving the second start signal and for outputting the second output signal that is shifted by one horizontal period from the second start signal; and a scan signal output unit for receiving the first and second output signals and for outputting a scan signal having a high level or a low level.

The first and second start signals may be input at an interval of 2n times one horizontal period, the scan signal may be output with a pulse width of 2n times one horizontal period, and the scan signals may overlap with each other by (2n−1) times one horizontal period, wherein "n" is a natural number.

The first and second start signals may be input at an interval of (2n+1) times one horizontal period, the scan signal may be output with a pulse width of (2n+1) times one horizontal period, and the scan signals may overlap with each other by 2n times of one horizontal period, wherein "n" is a natural number.

In an odd stage, the first clock signal may be applied to a first clock terminal and the second clock signal may be applied to a second clock terminal, and in an even stage, the second clock signal may be applied to the first clock terminal and the first clock signal may be applied to the second clock terminal.

In an odd stage, the first clock signal, the second clock signal, and a first interrupt signal of the two interrupt signals may be sequentially input to the up-signal output unit and the down-signal output unit, and in an even stage, the second clock signal, the first clock signal and a second interrupt signal of the two interrupt signals, the second interrupt signal, may be sequentially input to the up-signal output unit and the down-signal output unit.

In an odd stage, the first clock signal, the second clock signal and a first interrupt signal of the two interrupt signals may be sequentially input to the up-signal output unit, and the second clock signal, the first clock signal, and the second interrupt signal of the two interrupt signals may be sequentially input to the down-signal output unit. And in an even stage, the second clock signal, the first clock signal, and a second interrupt signal of the two interrupt signals may be sequentially input to the up-signal output unit, and the first clock signal, the second clock signal, and the first interrupt signal may be sequentially input to the down-signal output unit.

BRIEF DESCRIPTION OF THE DRAWINGS

The accompanying drawings, together with the specification, illustrate exemplary embodiments of the present invention, and, together with the description, serve to explain the principles of the embodiments of the present invention, in which.

DETAILED DESCRIPTION

Figure 1:
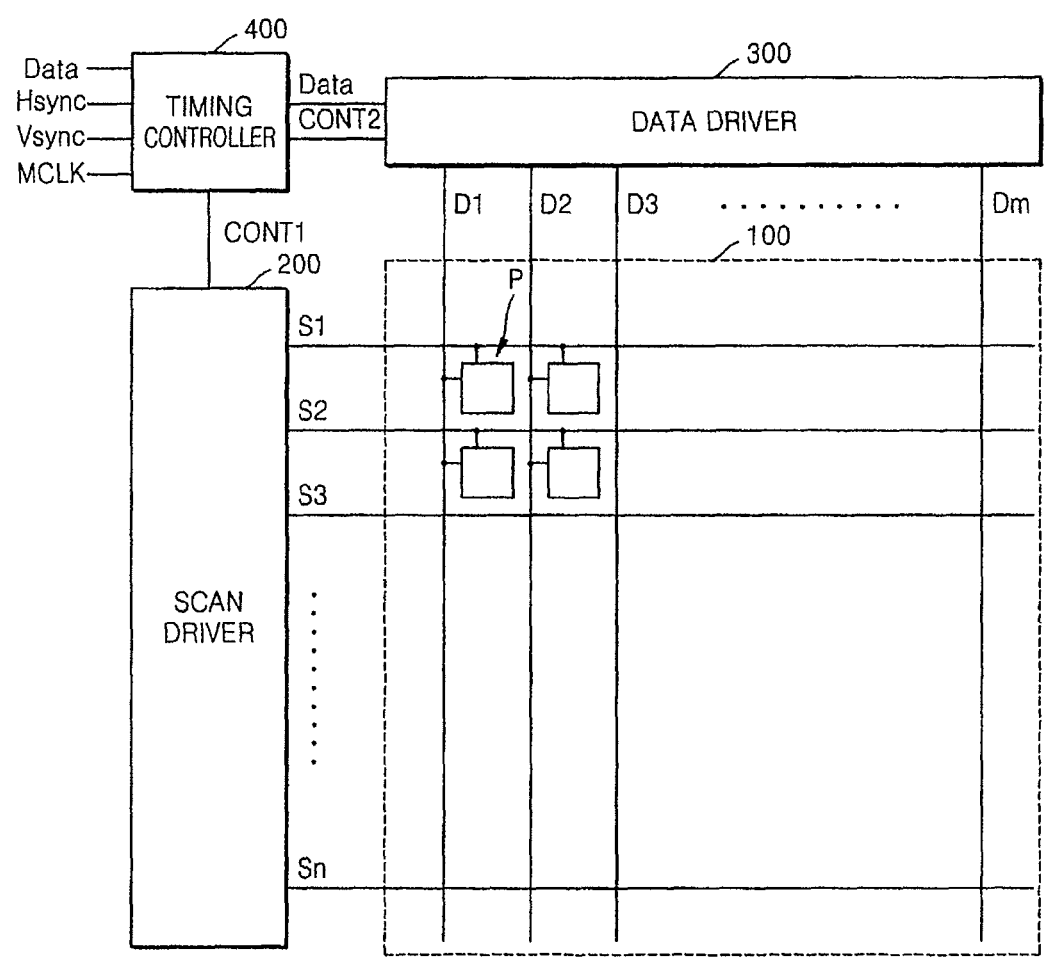
FIG. 1 is a circuit diagram schematically showing the structure of an organic light emitting display according to an embodiment of the present invention.

The attached drawings for illustrating exemplary embodiments of the present invention are referred to in order to sufficiently disclose aspects of the present invention, the merits thereof, and the results accomplished by the implementation of embodiments of the present invention. Hereinafter, exemplary embodiments of the present invention will be described with reference to the attached drawings. Like reference numerals in the drawings denote like elements.

A large organic light emitting panel can have a resolution of a full high definition (FHD) or higher, and can have an operating frequency of 120 Hz or higher. As a load on the scan line increases, an RC delay of a signal increases. Also, there is a problem of short scan time because of the large number of scan lines and high operating frequency. In this case, an abnormal scan signal may be output so that a normal data signal may not be provided to a pixel. Also, when the scan time is shortened in a compensation pixel circuit, a compensation time is shortened accordingly, and normal compensation may not be performed which can cause irregular images.

Thus, when the organic light emitting panel having a full high-definition (FHD) resolution is driven at the frequency of 120 Hz or higher, to prevent generation of an abnormal scan signal due to the short scan time, the organic light emitting panel may be driven with the scan signal having an increased pulse width.

FIG. 1 is a circuit diagram schematically showing the structure of an organic light emitting display according to an embodiment of the present invention. Referring to FIG. 1, the organic light emitting display includes an organic light emitting panel 100, a scan driver 200, a data driver 300, and a timing controller 400.

The organic light emitting panel 100 includes a plurality of scan lines S1-Sn, a plurality of data lines D1-Dm, and a plurality of pixels P. The scan lines S1-Sn are arranged in rows that are separated from one another, and each scan line transmits a scan signal. The data lines D1-Dm are arranged in columns that are separated from one another, and each data line transmits a data signal. The scan lines S1-Sn and the data lines D1-Dm are arranged in a matrix format. A pixel P is located at a crossing region where the scan line and the data line cross. When the pixel P is a current-write pixel, the data signal is a current. When the pixel P is a voltage-write pixel, the data signal is a voltage.

The scan driver 200 is coupled to the scan lines S1-Sn of the organic light emitting panel 100 and applies to the scan lines S1-Sn scan signals including a combination of a gate-on voltage and a gate-off voltage. The scan driver 200 may apply the scan signals such that a plurality of selection signals respectively applied to the scan lines S1-Sn can sequentially have a gate-on voltage. When the scan signal has a gate-on voltage, a switching transistor coupled to a corresponding scan line is turned on.

The scan driver 200 includes a plurality of stages, each working as a shift register. Each stage receives a pair of first and second start signals, a pair of first and second clock signals, and at least one of a pair of first and second interrupt signals, and outputs a scan signal. The scan driver 200 may be driven such that, while the first and second start signals are received at the interval of 2n times one horizontal period 1H and a scan signal is output with a pulse width of the interval of 2n times one horizontal period 1H (or horizontal cycle). Herein, "n" is a natural number. Neighboring scan signals may overlap with each other by (2n−1) times one horizontal period 1H. Also, the scan driver 200 may be driven such that, while the first and second start signals are received at the interval of (2n+1) times one horizontal period 1H, and a scan signal is output with a pulse width of the interval of (2n+1) times one horizontal period 1H. Neighboring scan signals can overlap with each other by 2n times one horizontal period 1H.

The data driver 300 is coupled to the data lines D1-Dm of the organic light emitting panel 100 and applies to the data lines D1-Dm data signals indicating a gradation (e.g., gray levels). The data driver 300 converts input image data Data having a gradation provided by the timing controller 400 to data signals in the form of a voltage or current.

The timing controller 400 receives the input image data Data and an input control signal for controlling the display of the input image data Data from an external graphic controller (not shown). The input control signal includes, for example, a horizontal sync signal Hsync, a vertical sync signal Vsync, and a main clock MCLK. The timing controller 400 transfers the input image data Data to the data driver 300, generates a scan control signal CONT1 and a data control signal CONT2, and transfers the generated scan control signal CONT1 and data control signal CONT2, respectively, to the scan driver 200 and the data driver 300. The scan control signal CONT1 includes a scan start signal SSP indicating scan start and a plurality of clock signals SCLK. The data control signal CONT2 includes clock signals and a horizontal sync start signal STH indicating transfer of the input image data Data with respect to pixels of a row.

When transferring the input image data Data corresponding to a row to the data driver 300, the timing controller 400 may transfer the input image data Data by color through three channels, or in order through one channel.

Figure 2:
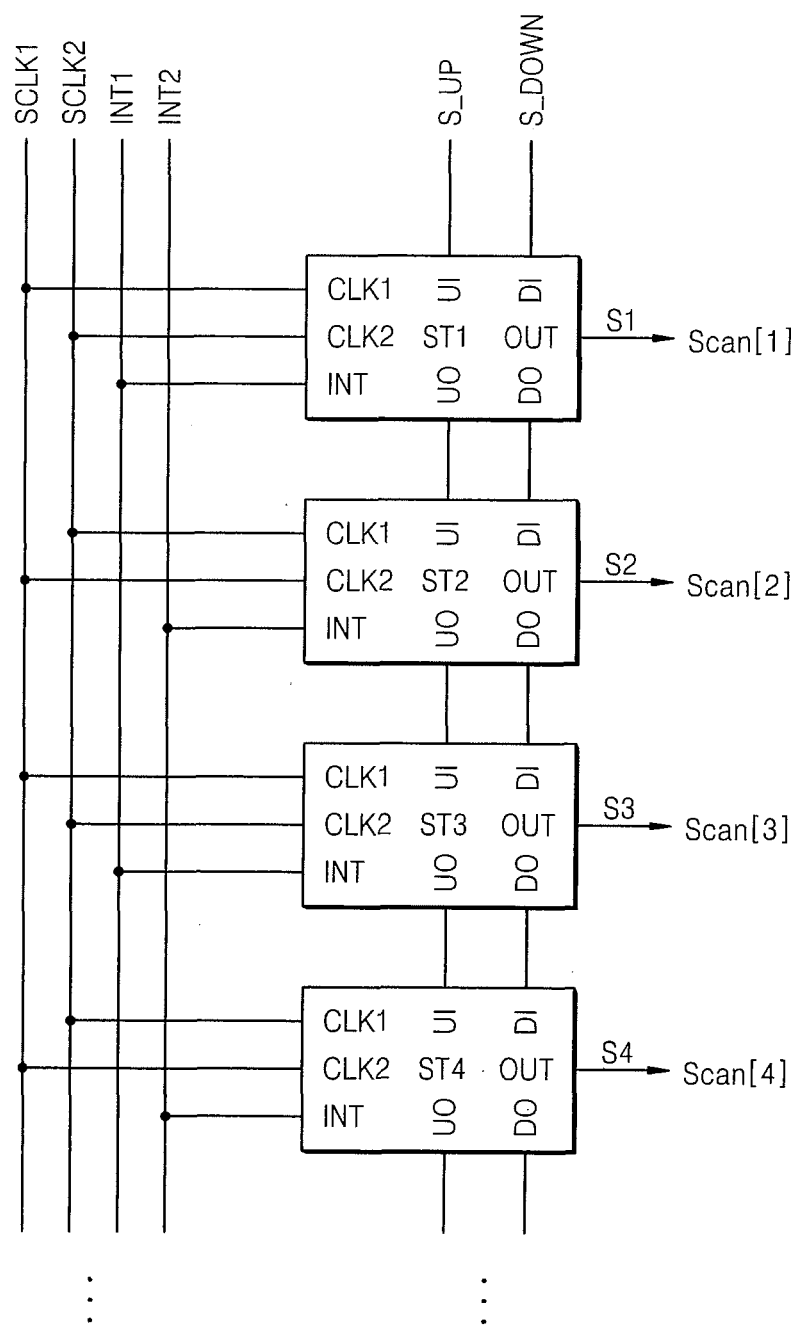
FIG. 2 is a schematic block diagram of a scan driver according to an embodiment of the present invention.
Figure 3:
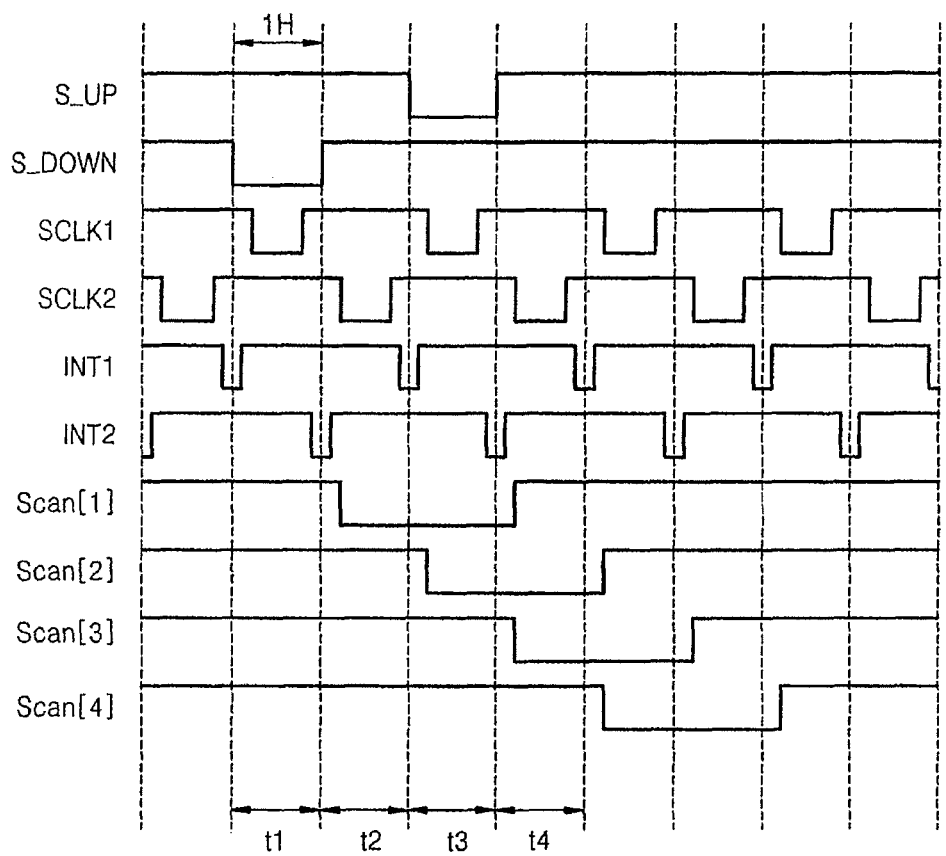
FIG. 3 is a timing diagram showing the operation of the scan driver illustrated in FIG. 2.

FIG. 2 is a schematic block diagram of a scan driver according to an embodiment of the present invention. FIG. 3 is a timing diagram showing the operation of the scan driver illustrated in FIG. 2.

Referring to FIGS. 2 and 3, the scan driver includes n-number of stages ST1-STn, respectively coupled to scan start signal (S_UP and S_DOWN) lines, two-phase clock signal (SCLK1 and SCLK2) lines, and one of two-phase interrupt signal (INT1 and INT2) lines. For convenience of explanation, FIGS. 2 and 3 illustrate only first through fourth stages ST1-ST4 and a timing diagram thereof. The scan signals S1-Sn, each output from an output terminal OUT of each stage, are provided to corresponding ones of the scan lines Scan[1]-Scan[n].

Each stage includes an up-signal output unit UST, a down-signal output unit DST, and a scan signal output unit SST. In the first stage ST1, the scan start signals S_UP and S_DOWN are respectively input to input terminals UI and DI of the up-signal output unit UST and the down-signal output unit DST. The output signals of the output terminals UO and DO of the up-signal output unit UST and the down-signal output unit DST of the front stage are respectively input to the input terminals UI and DI of the second through n-th stages ST2-STn.

The start signal S_UP of the up-signal output unit UST and the start signal S_DOWN of the down-signal output unit DST are input at the interval of two horizontal periods 2H. In an odd stage, the first clock signal SCLK1 is applied to a first clock terminal CLK1. The second clock signal SCLK2 having a phase delayed by an interval (e.g., a predetermined interval) of about one horizontal period from the first clock signal SCLK1, is applied to the second clock terminal CLK2. A first interrupt signal INT1 is applied to an interrupt terminal INT. In an even stage, the second clock signal SCLK2 is applied to the first clock terminal CLK1. The first clock signal SCLK1 is applied to the second clock terminal CLK2. A second interrupt signal INT2 having a phase delayed by one horizontal period from the first interrupt signal INT1 is applied to the interrupt terminal INT.

The scan signals S1-Sn provided to the scan lines Scan[1]-Scan[n] have a scan time of 2H (e.g., a scan pulse duration time.) The neighboring scan signals overlap with each other by 1H. The process of generating a scan signal in first through fourth time periods t1-t4 will be described later in detail.

Figure 4:
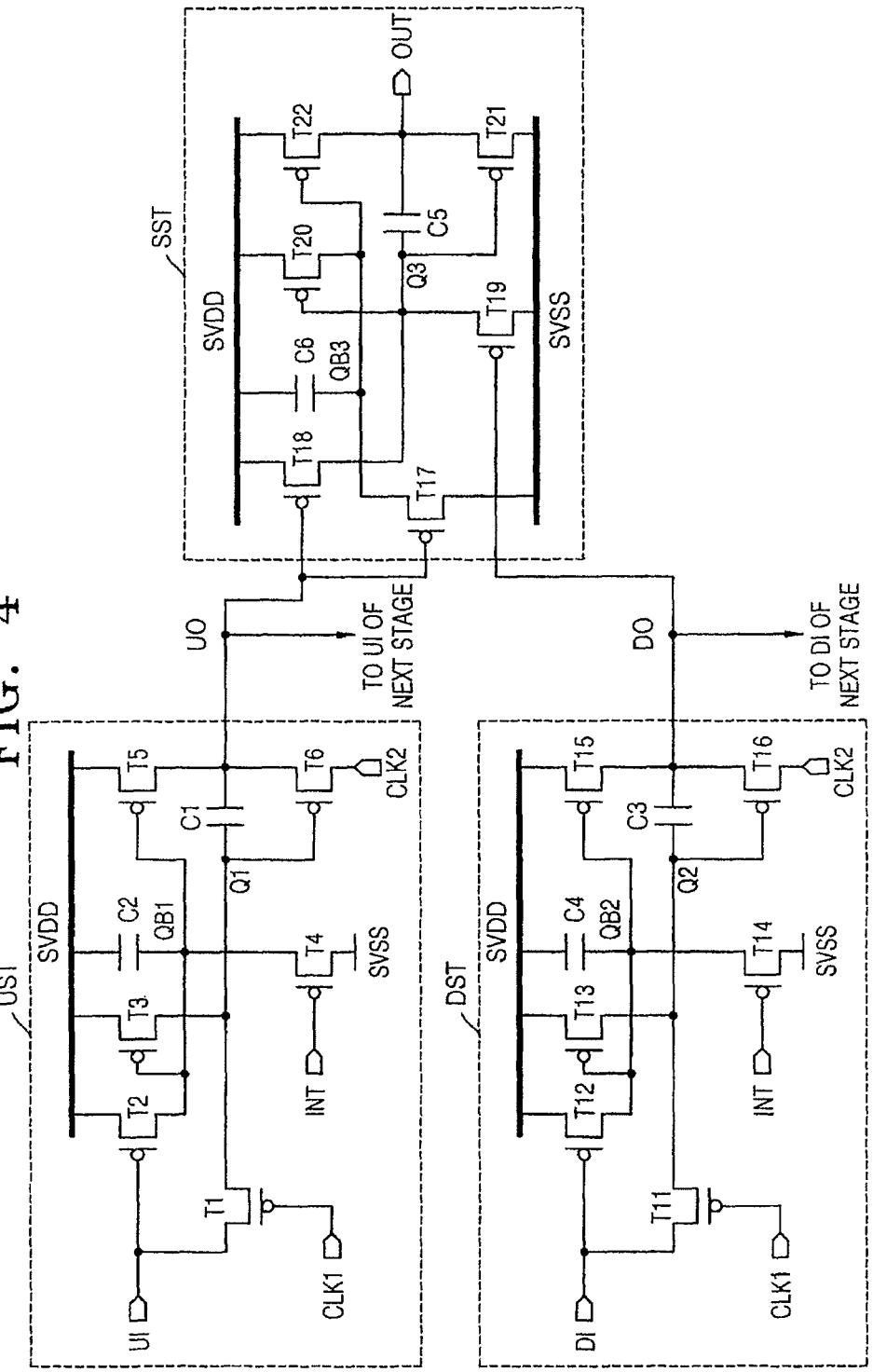
FIG. 4 is a detailed circuit diagram of a stage in the scan driver illustrated in FIG. 2.

FIG. 4 is a detailed circuit diagram of a stage ST in the scan driver illustrated in FIG. 2. Referring to FIG. 4, the stage ST includes the up-signal output unit UST, the down-signal output unit DST, and the scan signal output unit SST. In FIG. 4, the up-signal output unit UST, the down-signal output unit DST, and the scan signal output unit SST are operated by using the same high-level first power voltage SVDD and the same low-level second power voltage SVSS. However, the present invention is not limited thereto. The first power voltage SVDD is a high-level voltage provided by a first external power source, whereas the second power voltage SVSS is a low-level voltage provided by a second external power source.

In an odd stage, the low-level first clock signal SCLK1, the second clock signal SCLK2, and the first interrupt signal INT1 are sequentially input to the up-signal output unit UST. In an even stage, the low-level second clock signal SCLK2, the first clock signal SCLK1, and the second interrupt signal INT2 are sequentially input to the up-signal output unit UST.

The up-signal output unit UST receives the original start signal S_UP of a low level or an output signal of the up-signal output unit UST of the previous stage, via the input terminal UI, and transfers a low-level output signal that is shifted by 1H to the up-signal output unit UST of the next stage and the scan signal output unit SST, via the output terminal UO. Accordingly, the scan signal output unit SST outputs a high-level scan signal.

The up-signal output unit UST includes a first switching device T1, a second switching device T2, a third switching device T3, a fourth switching device T4, a fifth switching device T5, a sixth switching device T6, a first capacitive device C1, and a second capacitive device C2.

In the first switching device T1, a first electrode (a drain electrode or a source electrode) is electrically coupled to the input terminal UI, a second electrode (the source electrode or the drain electrode) is electrically coupled to a first node Q1, and a gate electrode is electrically coupled to the first clock terminal CLK1. When a low-level signal is applied to the gate electrode of the first switching device T1, the first switching device T1 is turned on and supplies a voltage of the input terminal UI to the first node Q1.

In the second switching device T2, a gate electrode is electrically coupled to the input terminal UI, a first electrode is electrically coupled to the first power source, and a second electrode is electrically coupled to a second node QB1. When a low-level signal is applied to the gate electrode of the second switching device T2, the second switching device T2 is turned on and supplies the first power voltage SVDD to the second node QB1.

In the third switching device T3, a first electrode is electrically coupled to the first power source, a second electrode is electrically coupled to the first node Q1, and a gate electrode is electrically coupled to the second node QB1. When a low-level signal is applied to the gate electrode of the third switching device T3, the third switching device T3 is turned on and supplies the first power voltage SVDD to the first node Q1.

In the fourth switching device T4, a first electrode is electrically coupled to the second node QB1, a second electrode is electrically coupled to the second power source, and a gate electrode is electrically coupled to the interrupt terminal INT. When an interrupt signal is applied to the gate electrode of the fourth switching device T4, the fourth switching device T4 is turned on and supplies the second power voltage SVSS to the second node QB1.

In the fifth switching device T5, a gate electrode is electrically coupled to the second node QB1, a first electrode is electrically coupled to the first power source, and a second electrode is electrically coupled to the output terminal UO. When a low-level signal is applied to the gate electrode of the fifth switching device T5, the fifth switching device T5 is turned on and supplies the first power voltage SVDD to the output terminal OUT.

In the sixth switching device T6, a gate electrode is electrically coupled to the first node Q1, a first electrode is electrically coupled to the output terminal UO, and a second electrode is electrically coupled to the second clock terminal CLK2. When a low-level signal is applied to the gate electrode of the sixth switching device T6, the sixth switching device T6 is turned on to provide the second clock signal SCLK2 received from the second clock terminal CLK2 to the output terminal OUT.

In the first capacitive device C1, a first electrode is electrically coupled to the first node Q1 and a second electrode is electrically coupled to the output terminal UO. The first capacitive device C1 stores a voltage difference between a voltage of the first node Q1 and a voltage of a node to which the output terminal UO is coupled, that is, the node to which the second electrode of the fifth switching device T5 and the first electrode of the sixth switching device T6 are electrically coupled.

In the second capacitive device C2, a first electrode is electrically coupled to the first power source and a second electrode is electrically coupled to the second node QB1. The second capacitive device C2 stores a voltage difference between the first and second electrodes.

The second electrode of the first switching device T1, the second electrode of the third switching device T3, and the gate electrode of the sixth switching device T6 are coupled to the first node Q1. The second electrode of the second switching device T2, the first electrode of the fourth switching device T4, the gate electrode of the third switching device T3, and the gate electrode of the first switching device T5 are coupled to the second node QB1.

In an odd stage, the low-level first clock signal SCLK1, the second clock signal SCLK2, and the first interrupt signal INT1 are sequentially input to the down-signal output unit DST. In an even stage, the low-level second clock signal SCLK2, the first clock signal SCLK1, and the second interrupt signal INT2 are sequentially input to the down-signal output unit DST.

The down-signal output unit DST receives the original low-level start signal S_DOWN or an output signal of the down-signal output unit DST of the previous stage, via the input terminal DI, and transfers a low-level output signal that is shifted by 1H to the down-signal output unit DST of the next stage and the scan signal output unit SST, via the output terminal DO. Accordingly, the scan signal output unit SST outputs a low-level scan signal.

The down-signal output unit DST includes an eleventh switching device T11, a twelfth switching device T12, a thirteenth switching device T13, a fourteenth switching device T14, a fifteenth switching device T15, a sixteenth switching device T16, a third capacitive device C3, and a fourth capacitive device C4. The respective elements of the down-signal output unit DST substantially correspond to the first switching device T1, the second switching device T2, the third switching device T3, the fourth switching device T4, the fifth switching device T5, the sixth switching device T6, the first capacitive device C1, and the second capacitive device C2 of the up-signal output unit UST, and the connection structures thereof are substantially the same, so that detailed descriptions thereof will be omitted herein. The down-signal output unit DST includes a third node Q2 and a fourth node QB2 which substantially correspond to the first node Q1 and the second node QB1 of the up-signal output unit UST.

The scan signal output unit SST receives low-level signals from the output terminals UO and DO, respectively, of the up-signal output unit UST and the down-signal output unit DST and outputs a high or low level scan signal to the scan line. The scan signal output unit SST includes a seventeenth switching device T17, an eighteenth switching device T18, a nineteenth switching device T19, a twentieth switching device T20, a twenty-first switching device T21, a twenty-second switching device T22, a fifth capacitive device C5, and a sixth capacitive device C6.

In the seventeenth switching device T17, a gate electrode is electrically coupled to the node of the output terminal UO of the up-signal output unit UST, a first electrode is electrically coupled to a sixth node QB3, and a second electrode is electrically coupled to the second power source. When a low-level signal is applied to the gate electrode of the seventeenth switching device T17, the seventeenth switching device T17 is turned on and supplies the second power voltage SVSS to the sixth node QB3.

In the eighteenth switching device T18, a gate electrode is electrically coupled to the node of the output terminal UO of the up-signal output unit UST, a first electrode is electrically coupled to the first power source, and a second electrode is electrically coupled to a fifth node Q3. When a low-level signal is applied to the gate electrode of the eighteenth switching device T18, the eighteenth switching device T18 is turned on and supplies the first power voltage SVDD to the fifth node Q3.

In the nineteenth switching device T19, a gate electrode is electrically coupled to the node of the output terminal DO of the down-signal output unit DST, a first electrode is electrically coupled to the fifth node Q3, and a second electrode is electrically coupled to the second power source. When a low-level signal is applied to the gate electrode of the nineteenth switching device T19, the nineteenth switching device T19 is turned on and supplies the second power voltage SVSS to the fifth node Q3.

In the twentieth switching device T20, a gate electrode is electrically coupled to the fifth node Q3, a first electrode is electrically coupled to the first power source, and a second electrode is electrically coupled to the sixth node QB3. When a low-level signal is applied to the gate electrode of the twentieth switching device T20, the twentieth switching device T20 is turned on and supplies the first power voltage SVDD to the sixth node QB3.

In the twenty-first switching device T21, a gate electrode is electrically coupled to the fifth node Q3, a first electrode is electrically coupled to the output terminal OUT, and a second electrode is electrically coupled to the second power source. When a low-level signal is applied to the gate electrode, the twenty-first switching device T21 is turned on and supplies the second power voltage SVSS to the output terminal OUT, and a low-level scan signal is output.

In the twenty-second switching device T22, a gate electrode is electrically coupled to the sixth node QB3, a first electrode is electrically coupled to the first power source, and a second electrode is electrically coupled to the output terminal OUT. When a low-level signal is applied to the gate electrode of the twenty-second switching device T22, the twenty-second switching device T22 is turned on and supplies the first power voltage SVDD to the output terminal OUT, and thus a high-level scan signal is output.

In the fifth capacitive device C5, a first electrode is electrically coupled to the fifth node Q3 and the second electrode is electrically coupled to the output terminal OUT node. In the sixth capacitive device C6, a first electrode is electrically coupled to the first power source and the second electrode is electrically coupled to the sixth node QB3.

In the above-described present embodiment, the switch devices T1-T22 are all implemented by PMOS transistors, however, the driving method may alternatively be implemented using NMOS transistors for the switch devices T1-T22 and inverting the signals.

The process of driving a stage STi will be described with reference to FIGS. 3 and 4. For convenience of explanation, the process of driving the first stage ST1 will be primarily discussed. However, the process similarly applies to the second to n-th stages ST2-STn.

In the first time period t1, the low-level [L] start signal S_DOWN is applied to the input terminal DI of the down-signal output unit DST, the first clock signal SCLK1 applied to the first clock terminal CLK1 is applied at a low level, and the second clock signal SCLK2 of the second clock terminal CLK2 is applied at a high level. For the input terminal DI of the second to n-th stages ST2-STn, the output signal of the down-signal output unit of the previous stage is a start signal. A high-level signal is applied to the interrupt terminal INT.

In this case, the twelfth switching device T12 is turned on by the low-level start signal S_DOWN to apply the first power voltage SVDD to the fourth node QB2. Accordingly, the thirteenth switching device T13 and the fifteenth switching device T15 are turned off. As the eleventh switching device T11 is turned on by the low-level first clock signal SCLK1, the low-level voltage is applied to the third node Q2 and the sum of the low-level second power voltage SVSS and threshold voltage |Vth| is pre-charged in the third node Q2 and the sixteenth switching device T16 is turned on.

Thus, the high-level second clock signal SCLK2 of the second clock terminal CLK2 is applied to the output terminal DO via the sixteenth switching device T16, and thus a high-level output signal is output. The output signal is input to the input terminal of the down-signal output unit of the second stage ST2.

In the up-signal output unit UST, the input terminal UI is maintained at a high level and the fifth switching device T5 is turned on by the low-level voltage charged in the second node QB1. Accordingly, the high-level first power voltage SVDD is supplied to the output terminal UO through the fifth switching device T5.

Consequently, the high-level signals from the output terminal UO of the up-signal output unit UST and the output terminal DO of the down-signal output unit DST are applied to the scan signal output unit SST. Thus, all switching devices of the scan signal output unit SST are turned-off. The fifth node Q3 and the sixth node QB3 are respectively maintained at a high level and a low level, as previously, by the fifth capacitive device C5 and the sixth capacitive device C6, and thus the final output terminal OUT outputs a high-level scan signal via the twenty-second switching device T22.

In the second time period t2, the start signal S_DOWN of the down-signal output unit DST and the first clock signal SCLK1 of the first clock terminal CLK1 are inverted to a high level, whereas the second clock signal SCLK2 of the second clock terminal CLK2 are inverted to a low level. In this case, switching devices, except for the sixteenth switching device T16, are all turned off by the high-level start signal S_DOWN and the first clock signal SCLK1.

The node voltage of the output terminal DO is decreased toward the second power voltage SVSS of the sixteenth switching device T16. Bootstrapping is generated by the third capacitive device C3 and the sixteenth switching device T16 is completely turned on. Thus, the low-level second clock signal SCLK2 is applied to the second electrode of the sixteenth switching device T16 via the second clock terminal CLK2, and a low-level output signal is output from the output terminal DO.

The low-level output signal of the down-signal output unit DST is input to the scan signal output unit SST, and the nineteenth switching device T19 may be turned on. Accordingly, the low-level second power voltage SVSS is applied to the fifth node Q3, and the twentieth switching device T20 and the twenty-first switching device T21 are turned on. As the twentieth switching device T20 is turned on, the high-level first power voltage SVDD is applied to the sixth node QB3, and the twenty-second switching device T22 is turned off. As the twenty-first switching device T21 is turned on, the voltage at the output terminal OUT decreases down to the second power voltage SVSS. The bootstrapping is generated by the fifth capacitive device C5, and thus the voltage of the fifth node Q3 is decreased to a voltage that is lower than the second power voltage SVSS (e.g., a voltage that is much lower than the second power voltage SVSS.) Also, the voltage at the output terminal OUT finally becomes similar or equal to the second power voltage SVSS.

Since the first node Q1 and the second node QB1 of the up-signal output unit UST maintain the previous state, that is, respectively, a high level and a low level, the output terminal UO of the up-signal output unit UST maintains a high level.

In the second time period t2, the low-level signal of the output terminal DO is applied to the input terminal DI of the down-signal output unit DST of the second stage ST2, as a start signal. Then, the low-level second clock signal SCLK2 is applied to the first clock terminal CLK1 of the down-signal output unit DST of the second stage ST2. Accordingly, the eleventh switching device T11 of the second stage ST2 is turned on and the low-level signal of the input terminal DI is applied to the third node Q2. As the third node Q2 is precharged to a low level, the sixteenth switching device T16 is turned on. According to the above process, a continuous shift register operation is performed between the first stage ST1 and the second stage ST2, which may be applied to the operation between other stages in the same or similar manner.

In the operation of the first stage ST1, a low-level first interrupt signal INT1 is applied to the interrupt terminal INT of the down-signal output unit DST during a transition from the second time period t2 to the third time period t3. Accordingly, as the fourteenth switching device T14 is turned on, the low-level second power voltage SVSS is applied to the fourth node QB2 and the fifteenth switching device T15 is turned on. Thus, the high-level first power voltage SVDD is output to the output terminal DO via the fifteenth switching device T15. Also, as the low-level second power voltage SVSS is applied to the fourth node QB2, the thirteenth switching device T13 is turned on. Accordingly, the high-level first power voltage SVDD is applied to the third node Q2 and the sixteenth switching device T16 is turned off.

Then, since the high-level start signal is maintained in the down-signal output unit DST, the down-signal output unit DST maintains the high-level voltage level regardless of the voltage level of the clock signals.

In the third time period t3, a low-level original start signal S_UP is applied to the input terminal UI of the up-signal output unit UST, a low-level first clock signal SCLK1 is applied to the first clock terminal CLK1, and the high-level second clock signal SCLK2 is applied to the second clock terminal CLK2. For the input terminal UI of the second to n-th stages ST2-STn, the output signal of the up-signal output unit of the previous stage is a start signal. A high-level signal is applied to the interrupt terminal INT.

In this case, the second switching device T2 is turned on by the low-level start signal S_UP and the first power voltage SVDD is applied to the second node QB1. Accordingly, the third switching device T3 and the fifth switching device T5 are turned off. As the first switching device T1 is turned on by the low-level first clock signal SCLK1, the low-level voltage is applied to the first node Q1 and the sum (SVSS+|Vth|) of the second power voltage SVSS and the threshold voltage |Vth| is pre-charged in the first node Q1. Accordingly, the sixth switching device T6 is turned on.

Thus, the high-level second clock signal SCLK2 applied to the second clock terminal CLK2 is applied to the output terminal UO via the sixth switching terminal T6, and thus a high-level output signal is output. The output signal is input to the input terminal of the up-signal output unit of the second stage ST2.

In the scan signal output unit SST, switching devices, except for the twenty-first switching device T21, are all tuned off by the high-level signals output from the up-signal output unit UST and the down-signal output unit DST. Thus, the low-level second power voltage SVSS is output from the output terminal OUT.

In the fourth time period t4, the start signal S_UP of the input terminal UI of the up-signal output unit UST and the first clock signal SCLK1 applied to the first clock terminal CLK1 are inverted to a high level, whereas the second clock signal SCLK2 applied to the second clock terminal CLK2 is inverted to a low level. In this case, the other switching devices, except for the sixth switching device T6, are all turned off by the high-level start signal S_UP and the first clock signal SCLK1.

The voltage of the output terminal UO node is decreased toward the second power voltage SVSS via the sixth switching device T6. As the charged voltage is discharged by the first capacitive device C1, bootstrapping is generated and thus the sixth switching device T6 is completely turned on. Thus, the low-level second clock signal SCLK2 is applied to the second electrode of the sixth switching device T6 via the second clock terminal CLK2, and a low-level output signal is output from the output terminal UO.

The low-level output signal of the up-signal output unit UST is input to the scan signal output unit SST and thus the seventeenth switching device T17 and the eighteenth switching device T18 are turned on. Accordingly, the low-level second power voltage SVSS is applied to the sixth node QB3, and the high-level first power voltage SVDD is applied to the fifth node Q3. Thus, the twenty-second switching device T22 is turned on, whereas the twenty-first switching device T21 is turned off. The high-level first power voltage SVDD is output from the output terminal OUT as a scan signal.

In the fourth time period t4, the low-level signal of the output terminal UO is applied to the input terminal UI of the up-signal output unit DST of the second stage ST2, as the start signal. The low-level second clock signal SCLK2 is applied to the first clock terminal CLK1. Accordingly, as the first switching device T1 of the second stage ST2 is turned on, the low-level signal of the input terminal UI is applied to the first node Q1 and thus the first node Q1 is pre-charged to a low level. Accordingly, the first switching device T6 is turned on. According to the above process, a continuous shift register operation is performed between the first stage ST1 and the second stage ST2, which may be applied to the operation between other stages in the same or similar manner.

In the above embodiment, the interval between the start signal S_UP of the up-signal output unit UST and the start signal S_DOWN of the down-signal output unit DST is set to two horizontal periods 2H. Thus, the scan signals having a pulse width of 2H are driven to overlap with each other by 1H. Also, by changing the interval between the start signal S_UP of the up-signal output unit UST and the start signal S_DOWN of the down-signal output unit DST to 2nH, the scan signals having a pulse width of 2nH, are driven to overlap with each other by (2n–1)H. Herein, "n" is a natural number.

Figure 5:
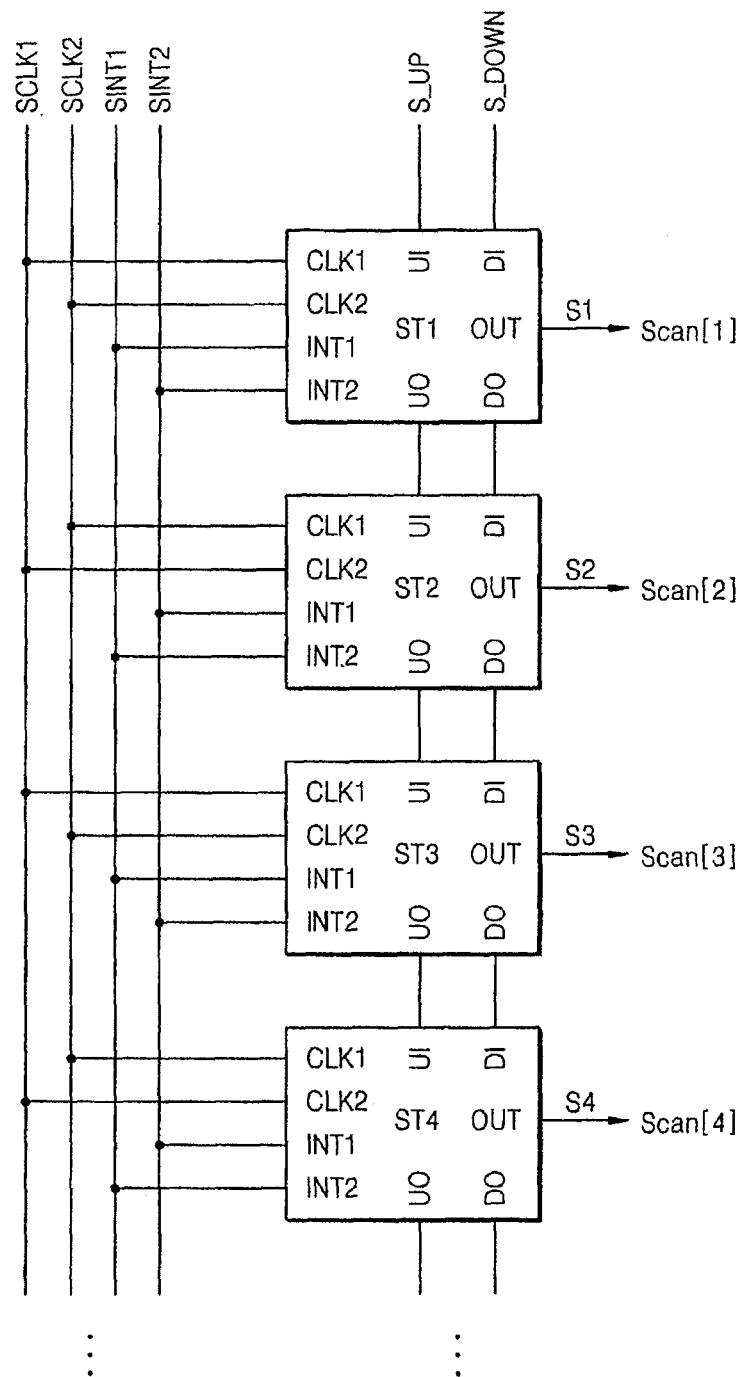
FIG. 5 is a schematic block diagram of a scan driver according to another embodiment of the present invention.
Figure 6:
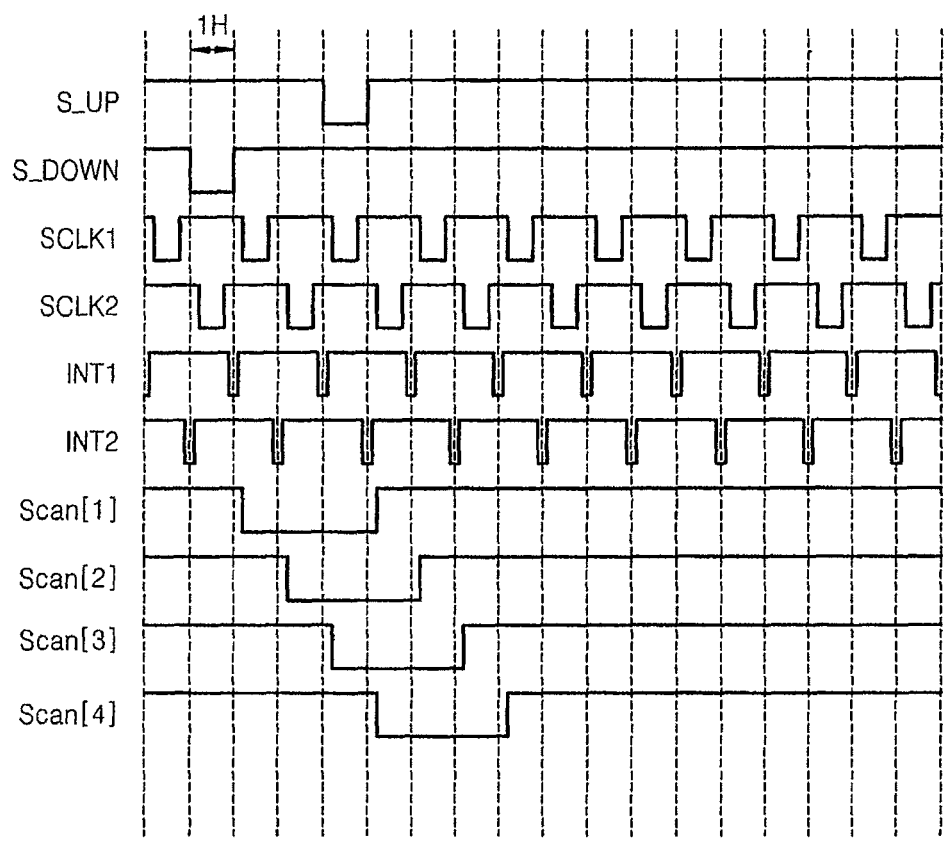
FIG. 6 is a timing diagram of the scan driver as illustrated in FIG. 5.

FIG. 5 is a schematic block diagram of a scan driver according to another embodiment of the present invention. FIG. 6 is a timing diagram of the scan driver of FIG. 5.

Referring to FIGS. 5 and 6, the scan driver of the present embodiment includes n-number of stages ST1-STn, respectively coupled to scan start signal (S_UP and S_DOWN) lines, two-phase clock signals (SCLK1 and SCLK2) lines, and two-phase interrupt signal (INT1 and INT2) lines. For convenience of explanation, FIGS. 5 and 6 illustrate only first through fourth stages ST1-ST4 and a timing diagram thereof. The scan signals S1-Sn, each output from an output terminal OUT of each stage, are provided to corresponding ones of the scan lines Scan[1]-Scan[n].

Each stage includes the up-signal output unit UST, the down-signal output unit DST, and the scan signal output unit SST. In the first stage ST1, the scan start signals S_UP and S_DOWN are respectively input to the input terminals UI and DI of the up-signal output unit UST and the down-signal output unit DST. In the second through n-th stages ST2-STn, the output signals of the output terminals UO and DO of the up-signal output unit UST and the down-signal output unit DST of the front stage are respectively input to the input terminals UI and DI as a start signal.

The start signal S_UP of the up-signal output unit UST and the start signal S_DOWN of the down-signal output unit DST are input at the interval of three horizontal periods 3H. In an odd stage, the first clock signal SCLK1 is applied to a first clock terminal CLK1. The second clock signal SCLK2 having a phase delayed by an interval (e.g., a predetermined interval) of about one horizontal period from the first clock signal SCLK1, is applied to the second clock terminal CLK2. A first interrupt signal SINT1 is applied to the interrupt terminal INT1. A second interrupt signal SINT2 having a phase delayed, by an interval (e.g., a predetermined interval) of about one horizontal period from the first interrupt signal SINT1 is applied to the second interrupt terminal INT2.

In an even stage, the second clock signal SCLK2 is applied to the first clock terminal CLK1. The first clock signal SCLK1 is applied to the second clock terminal CLK2. The second interrupt signal SINT2 is applied to the first interrupt terminal INT1. The first interrupt signal SINT1 is applied to the second interrupt terminal INT2.

The scan signals S1-Sn provided to the scan lines Scan[1]-Scan[n] have a scan period of 3H, that is, a scan pulse duration time. The neighboring scan signals overlap with each other by 2H.

Figure 7:
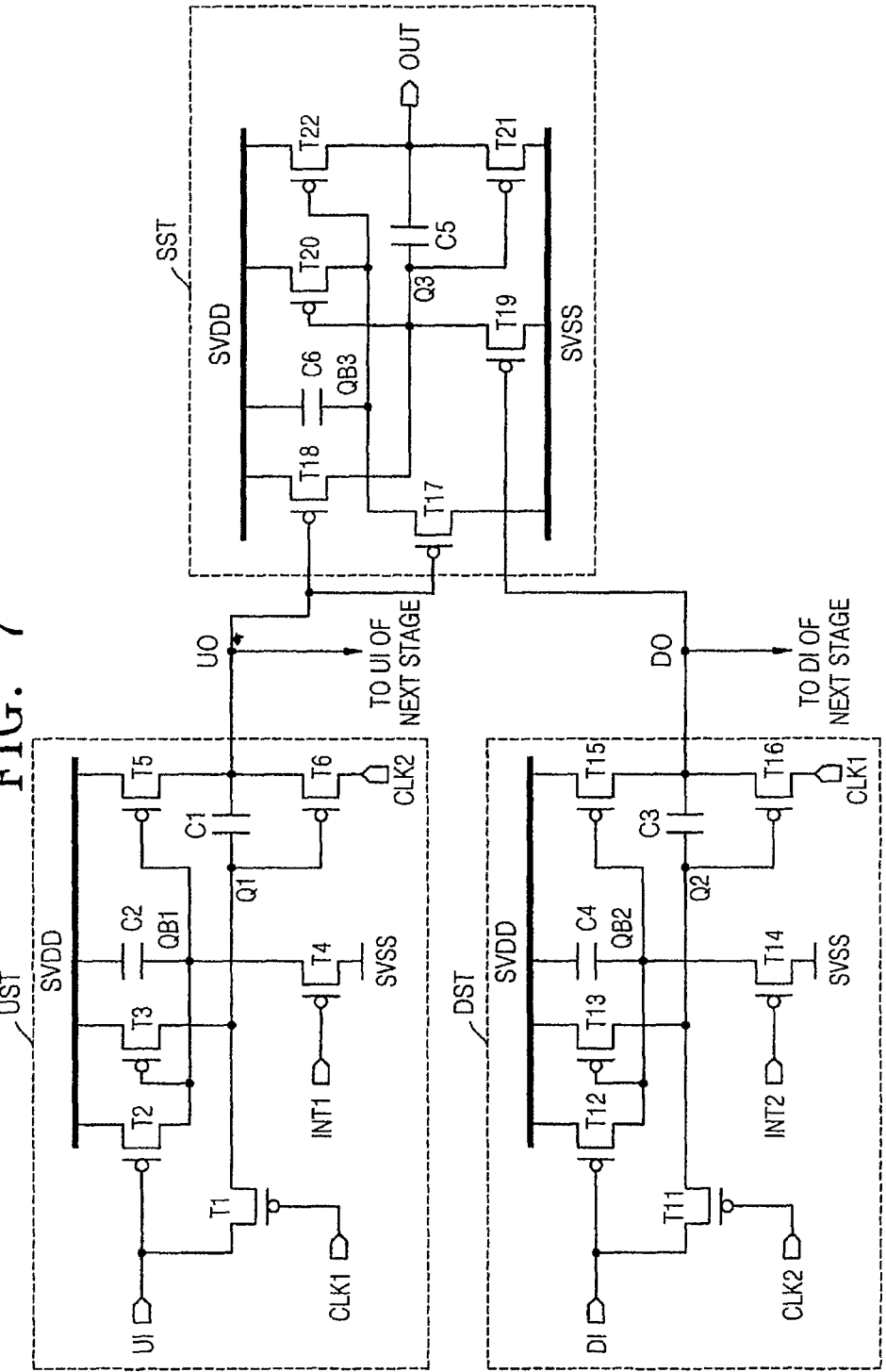
FIG. 7 is a detailed circuit diagram of a stage in the scan driver of FIG. 5.

FIG. 7 is a detailed circuit diagram of a stage Si in the scan driver of FIG. 5. Since the structure and operation of the stage circuit of the present embodiment are the same or similar to those of the stage circuit of FIG. 4, except for the differences in the input signal of each of the clock terminals and the interrupt terminals in the up-signal output unit and the down-signal output unit, detailed descriptions thereof will be omitted herein.

Referring to FIGS. 6 and 7, according to an embodiment herein, a stage ST includes the up-signal output unit UST, the down-signal output unit DST, and the scan signal output unit SST. The first clock terminal CLK1 and the second clock terminal CLK2 are electrically coupled to gate terminals of the first and eleventh switching devices T1 and T11 of the up-signal output unit UST and the down-signal output unit DST, respectively. The second clock terminal CLK2 and the first clock terminal CLK1 are electrically coupled to second electrodes of the sixth and sixteenth switching devices T6 and T16 of the up-signal output unit UST and the down-signal output unit DST, respectively. The first interrupt terminal INT1 and the second interrupt terminal INT2 are electrically coupled to gate electrodes of the fourth and fourteenth switching devices T4 and T14 of the up-signal output unit UST and the down-signal output unit DST, respectively.

In an odd stage, the low-level first clock signal SCLK1, second clock signal SCLK2, and the first interrupt signal SINT1 are sequentially input to the up-signal output unit UST. In an even stage, the low-level second clock signal SCLK2, first clock signal SCLK1, and second interrupt signal SINT2 are sequentially input to the up-signal output unit UST.

In an odd stage, the low-level second clock signal SCLK2, first clock signal SCLK1, and second interrupt signal SINT2 are sequentially input to the down-signal output unit DST. In an even stage, the low-level first clock signal SCLK1, second clock signal SCLK2, and first interrupt signal SINT1 are sequentially input to the down-signal output unit DST.

The scan signal output unit SST receives the low-level signals from the output terminals of the up-signal output unit UST and the down-signal output unit DST, and outputs high level or low level scan signals to the scan lines.

In the operation process of the odd stage, as the low-level start signal S_DOWN and second clock signal SCLK2 are applied to the input terminal DI and the second clock terminal CLK2 of the down-signal output unit DST, a low-level voltage is supplied to the third node Q2. Accordingly, the sixteenth switching device T16 is turned on and thus a high-level signal is output from the node of the output terminal DO.

Then, the high-level signals from the output terminal UO of the up-signal output unit UST and the output terminal DO of the down-signal output unit DST are applied to the scan signal output unit SST. Thus, all switching devices of the scan signal output unit SST are turned off. The fifth node Q3 and the sixth node QB3 are respectively maintained at a high level and a low level, as previously, by the fifth capacitive device C5 and the sixth capacitive device C6, and thus the node of the final output terminal OUT outputs a high-level scan signal by the twenty-second switching device T22.

When the low-level first clock signal SCLK1 is applied, the node voltage of the output terminal DO is decreased toward the second power voltage SVSS by the sixteenth switching device T16. The bootstrapping is generated by the third capacitive device C3, and thus the sixteenth switching device T16 is completely turned on. Accordingly, the low-level first clock signal SCLK1 is applied to the output terminal DO by the sixteenth switching device T16 and thus a low-level output signal is output from the output terminal DO. Thus, the nineteenth switching device T19 of the scan signal output unit SST is turned on and thus a low-level signal is applied to the fifth node Q3. As a result, the twenty-first switching device T21 is turned on and thus a low-level scan signal is output from the output terminal OUT. In other words, the scan signal output unit SST outputs a low-level scan signal by the first clock signal SCLK1 of the down-signal output unit DST.

Then, as the low-level second interrupt signal SINT2 is applied to the second interrupt terminal INT2, the fourteenth switching device T14 is turned on, and a low-level voltage is supplied to the fourth node QB2. Accordingly, the thirteenth switching device T13 is turned on, and thus a high-level voltage is applied to the third node Q2 and the sixteenth switching device T16 is turned off. Then, since the start signal applied to the input terminal DI of the down-signal output unit DST maintains a high level, the output level of the down-signal output unit DST maintains a high level regardless of the voltage level of the clock signal.

The start signal is applied to the up-signal output unit UST three horizontal periods after the start signal is provided to the down-signal output unit DST. The low-level start signal S_UP and first clock signal SCLK1 are applied to the input terminal UI and the first clock terminal CLK1 of the up-signal output unit UST and thus a low-level voltage is applied to the first node Q1. Accordingly, the sixth switching device T6 is turned on, and thus a high-level signal of the second clock signal SCLK2 is output to the output terminal UO.

When the low-level second clock signal SCLK2 is applied, the node voltage of the output terminal DO is decreased toward the second power voltage SVSS by the sixteenth switching device T16. The bootstrapping is generated by the first capacitive device C1, and thus the sixth switching device T6 is completely turned on. Accordingly, the low-level second clock signal SCLK2 is supplied to the output terminal UO by the sixth switching device T6, and thus a low-level output signal is output from the output terminal UO.

Thus, the seventeenth switching device T17 and the eighteenth switching device T18 of the scan signal output unit SST are turned on, and thus a low-level signal is supplied to the sixth node QB3, and a high-level signal is supplied to the fifth node Q3. As a result, the twenty-second switching device T22 is turned on and thus a high-level scan signal is output from the output terminal OUT. In other words, the scan signal output unit SST outputs a high-level scan signal by the second clock signal SCLK2 of the up-signal output unit UST.

Then, as the low-level first interrupt signal SINT1 is supplied to the first interrupt terminal INT1, the fourth switching device T4 is turned on, and thus a low-level signal is applied to the second node QB1. Accordingly, the third switching device T3 is turned on, and thus a high-level voltage is applied to the first node Q1 and the sixth switching device T6 is turned off.

In the above embodiment, with the interval between the start signal S_UP of the up-signal output unit UST and the start signal S_DOWN of the down-signal output unit DST set to three horizontal periods 3H, the scan signals, each having a pulse width of 3H, overlap with each other by 2H. Also, by changing the interval between the start signal S_UP of the up-signal output unit UST and the start signal S_DOWN of the down-signal output unit DST to (2n+1)H, in the same circuit, the scan signals, each having a pulse width of (2n+1)H, are driven by overlapping each other by 2nH. Herein, "n" is a natural number.

In the above embodiments, a process of an odd stage is primarily described, but the same or similar process applies to an even stage.

In embodiments of the present invention, by adjusting the interval between the start signals of the up-signal output unit and the down-signal output unit applied to the respective stages, the pulse width of the scan signal becomes 2H or higher (2nH or (2n+1)H) and the overlap period of 1H or higher ((2n−1)H or 2nH) may be provided between the scan signals of the neighboring stages. Thus, during the driving of an organic light emitting panel of FHD 120 Hz or higher, by increasing the pulse width of a scan signal by two horizontal (2H) periods or higher, generation of an abnormal scan signal due to the short scan time may be reduced or prevented, and a uniform image may be provided during the driving of an organic light emitting panel of FHD 120 Hz or higher.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A scan driver for driving s scan lines, "s" being a natural number, the scan driver comprising:
   a plurality of s stages, each stage of the s stages for receiving a first start signal and a second start signal, a first clock signal and a second clock signal, and at least one of two interrupt signals, and for outputting a scan signal, each stage comprising:
      an up-signal output unit for receiving the first start signal and outputting a first output signal that is shifted by one horizontal period from the first start signal;
      a down-signal output unit for receiving the second start signal and outputting a second output signal that is shifted by one horizontal period from the second start signal; and
      a scan signal output unit connected to a corresponding scan line of the s scan lines, and for receiving the first and second output signals and for outputting the scan signal having a high level or a low level to the scan line,
   wherein the first and second start signals are input with an interval of 2n times one horizontal period, "n" being a natural number, the scan signal is output with a pulse width of 2n times one horizontal period, and the scan signals overlap with each other by (2n−1) times one horizontal period, or
   wherein the first and second start signals are input with an interval of (2n+1) times one horizontal period, the scan signal is output with a pulse width of (2n+1) times one horizontal period, and the scan signals overlap with each other by 2n times one horizontal period.

2. The scan driver of claim 1, wherein,
   in an odd stage of the s stages, the first clock signal is applied to a first clock terminal and the second clock signal is applied to a second clock terminal, and in an even stage of the s stages, the second clock signal is applied to the first clock terminal and the first clock signal is applied to the second clock terminal.

3. The scan driver of claim 1, wherein the up-signal output unit comprises:
a second switching device comprising a gate electrode coupled to a first input terminal for receiving the first start signal, a first electrode coupled to a first power source, and a second electrode coupled to a second node;
a first switching device comprising a gate electrode coupled to a first clock terminal for receiving the first clock signal, a first electrode coupled to the first input terminal, and a second electrode coupled to a first node;
a third switching device comprising a gate electrode coupled to the second node, a first electrode coupled to the first power source, and a second electrode coupled to the first node;
a fourth switching device comprising a gate electrode coupled to an interrupt terminal for receiving a first interrupt signal of the two interrupt signals, a first electrode coupled to the second node, and a second electrode coupled to a second power source;
a fifth switching device comprising a gate electrode coupled to the second node, a first electrode coupled to the first power source, and a second electrode coupled to a first output terminal; and
a sixth switching device comprising a gate electrode coupled to the first node, a first electrode coupled to the first output terminal, and a second electrode coupled to a second clock terminal for receiving the second clock signal.

4. The scan driver of claim 3, further comprising:
a first capacitive device coupled between the first node and the first output terminal; and
a second capacitive device coupled between the first power source and the second node.

5. The scan driver of claim 1, wherein the first and second start signals are input with an interval of 2n times one horizontal period, the scan signal is output with a pulse width of 2n times one horizontal period, the scan signals overlap with each other by (2n−1) times one horizontal period, and the down-signal output unit comprises:
a twelfth switching device comprising a gate electrode coupled to a second input terminal for receiving the second start signal, a first electrode coupled to a first power source, and a second electrode coupled to a fourth node;
an eleventh switching device comprising a gate electrode coupled to a first clock terminal for receiving the first clock signal, a first electrode coupled to the second input terminal, and a second electrode coupled to a third node;
a thirteenth switching device comprising a gate electrode coupled to the fourth node, a first electrode coupled to the first power source, and a second electrode coupled to the third node;
a fourteenth switching device comprising a gate electrode coupled to an interrupt terminal for receiving a first interrupt signal received by the up-signal output unit from among the two interrupt signals, a first electrode coupled to the fourth node, and a second electrode coupled to a second power source;
a fifteenth switching device comprising a gate electrode coupled to the fourth node, a first electrode coupled to the first power source, and a second electrode coupled to a second output terminal; and
a sixteenth switching device comprising a gate electrode coupled to the third node, a first electrode coupled to the second output terminal, and a second electrode coupled to a second clock terminal for receiving the second clock signal.

6. The scan driver of claim 5, further comprising:
a third capacitive device coupled between the third node and the second output terminal; and
a fourth capacitive device coupled between the first power source and the fourth node.

7. The scan driver of claim 1, wherein the first and second start signals are input with an interval of (2n+1) times one horizontal period, the scan signal is output with a pulse width of (2n+1) times one horizontal period, the scan signals overlap with each other by 2n times one horizontal period, and the down-signal output unit comprises:
a twelfth switching device comprising a gate electrode coupled to a second input terminal for receiving the second start signal, a first electrode coupled to a first power source, and a second electrode coupled to a fourth node;
an eleventh switching device comprising a gate electrode coupled to a second clock terminal for receiving the second clock signal, a first electrode coupled to the second input terminal, and a second electrode coupled to a third node;
a thirteenth switching device comprising a gate electrode coupled to the fourth node, a first electrode coupled to the first power source, and a second electrode coupled to the third node;
a fourteenth switching device comprising a gate electrode coupled to an interrupt terminal for receiving a second interrupt signal of the two interrupt signals, wherein the second interrupt signal is phase-shifted from a first interrupt signal received by the up-signal output unit from among the two interrupt signals, a first electrode coupled to the fourth node, and a second electrode coupled to a second power source;
a fifteenth switching device comprising a gate electrode coupled to the fourth node, a first electrode coupled to the first power source, and a second electrode coupled to a second output terminal; and
a sixteenth switching device comprising a gate electrode coupled to the third node, a first electrode coupled to the second output terminal, and a second electrode coupled to a second clock terminal for receiving the first clock signal.

8. The scan driver of claim 7, further comprising:
a third capacitive device coupled between the third node and the second output terminal; and
a fourth capacitive device coupled between the first power source and the fourth node.

9. The scan driver of claim 1, wherein the scan signal output unit comprises:
an eighteenth switching device comprising a gate electrode coupled to an output terminal of the up-signal output unit, a first electrode coupled to a first power source, and a second electrode coupled to a fifth node;
a seventeenth switching device comprising a gate electrode coupled to the output terminal of the up-signal output unit, a first electrode coupled to a sixth node, and a second electrode coupled to a second power source;
a nineteenth switching device comprising a gate electrode coupled to an output terminal of the down-signal output unit, a first electrode coupled to the fifth node, and a second electrode coupled to the second power source;

a twentieth switching device comprising a gate electrode coupled to the fifth node, a first electrode coupled to the first power source, and a second electrode coupled to the sixth node;

a twenty-first switching device comprising a gate electrode coupled to the fifth node, a first electrode coupled to a third output terminal, and a second electrode coupled to the second power source; and a twenty-second switching device comprising a gate electrode coupled to the sixth node, a first electrode coupled to the first power source, and a second electrode coupled to the third output terminal.

10. The scan driver of claim 9, further comprising:
a fifth capacitive device coupled between the fifth node and the third output terminal; and
a sixth capacitive device coupled between the first power source and the sixth node.

11. The scan driver of claim 1, wherein
the first start signal is an original first start signal from outside of the s stages or the first output signal of the up-signal output unit in a previous stage of the s stages, and
the second start signal is an original second start signal from outside of the s stages or the second output signal of the down-signal output unit in the previous stage.

12. The scan driver of claim 1, wherein
the first and second start signals are input with an interval of 2n times one horizontal period, the scan signal is output with a pulse width of 2n times one horizontal period, the scan signals overlap with each other by (2n−1) times one horizontal period,
in an odd stage of the s stages, the first clock signal, the second clock signal, and a first interrupt signal of the two interrupt signals are sequentially input to the up-signal output unit and the down-signal output unit, and
in an even stage of the s stages, the second clock signal, the first clock signal, and a second interrupt signal of the two interrupt signals are sequentially input to the up-signal output unit and the down-signal output unit.

13. The scan driver of claim 1, wherein
the first and second start signals are input with an interval of (2n+1) times one horizontal period, the scan signal is output with a pulse width of (2n+1) times one horizontal period, the scan signals overlap with each other by 2n times one horizontal period,
in an odd stage of the s stages, the first clock signal, the second clock signal, and a first interrupt signal of the two interrupt signals are sequentially input to the up-signal output unit, and the second clock signal, the first clock signal, and a second interrupt signal of the two interrupt signals are sequentially input to the down-signal output unit, and
in an even stage of the s stages, the second clock signal, the first clock signal, and the second interrupt signal are sequentially input to the up-signal output unit, and the first clock signal, a second clock signal, and the first interrupt signal are sequentially input to the down-signal output unit.

14. An organic light emitting display comprising:
an organic light emitting panel comprising a plurality of pixels located at crossing regions of a plurality of data lines and a plurality of s scan lines, "s" being a natural number;
a data driver coupled to the plurality of data lines, and configured to apply data signals to the plurality of data lines; and
a scan driver coupled to the plurality of s scan lines, the scan driver comprising a plurality of s stages, each stage of the s stages for receiving a first start signal and a second start signal, a first clock signal and a second clock signal, and at least one of two interrupt signals, and outputting a scan signal, each stage comprising:
an up-signal output unit for receiving the first start signal and for outputting a first output signal that is shifted by one horizontal period from the first start signal;
a down-signal output unit for receiving the second start signal and for outputting a second output signal that is shifted by one horizontal period from the second start signal; and
a scan signal output unit connected to a corresponding scan line of the s scan lines, and for receiving the first and second output signals and for outputting the scan signal having a high level or a low level to the scan line,
wherein the first and second start signals are input at an interval of 2n times one horizontal period, "n" being a natural number, the scan signal is output with a pulse width of 2n times one horizontal period, and the scan signals overlap with each other by (2n−1) times one horizontal period, or
wherein the first and second start signals are input at an interval of (2n+1) times one horizontal period, the scan signal is output with a pulse width of (2n+1) times one horizontal period, and the scan signals overlap with each other by 2n times of one horizontal period.

15. The organic light emitting display of claim 14, wherein,
in an odd stage of the s stages, the first clock signal is applied to a first clock terminal and the second clock signal is applied to a second clock terminal, and
in an even stage of the s stages, the second clock signal is applied to the first clock terminal and the first clock signal is applied to the second clock terminal.

16. The organic light emitting display of claim 14, wherein
the first and second start signals are input with an interval of 2n times one horizontal period, the scan signal is output with a pulse width of 2n times one horizontal period, the scan signals overlap with each other by (2n−1) times one horizontal period,
in an odd stage of the s stages, the first clock signal, the second clock signal, and a first interrupt signal of the two interrupt signals are sequentially input to the up-signal output unit and the down-signal output unit, and
in an even stage of the s stages, the second clock signal, the first clock signal and a second interrupt signal of the two interrupt signals, are sequentially input to the up-signal output unit and the down-signal output unit.

17. The organic light emitting display of claim 14, wherein
the first and second start signals are input with an interval of (2n+1) times one horizontal period, the scan signal is output with a pulse width of (2n+1) times one horizontal period, the scan signals overlap with each other by 2n times one horizontal period,
in an odd stage of the s stages, the first clock signal, the second clock signal and a first interrupt signal of the two interrupt signals are sequentially input to the up-signal output unit, and the second clock signal, the first clock signal, and a second interrupt signal of the two interrupt signals are sequentially input to the down-signal output unit, and
in an even stage of the s stages, the second clock signal, the first clock signal, and the second interrupt signal are sequentially input to the up-signal output unit, and the first clock signal, the second clock signal, and the first interrupt signal are sequentially input to the down-signal output unit.

\* \* \* \* \*